(12) United States Patent
Clark et al.

(10) Patent No.: US 6,388,475 B1
(45) Date of Patent: May 14, 2002

(54) VOLTAGE TOLERANT HIGH DRIVE PULL-UP DRIVER FOR AN I/O BUFFER

(75) Inventors: Lawrence T. Clark, Phoenix, AZ (US); Adam Brand, Mountain View, CA (US)

(73) Assignee: Intle Corporation, Sasnta Clara, CA (US)

( * ) Notice: Subject to any disclaimer, the term of this patent is extended or adjusted under 35 U.S.C. 154(b) by 0 days.

(21) Appl. No.: 09/474,566

(22) Filed: Dec. 29, 1999

(51) Int. Cl.[7] .................................................. H03B 1/00

(52) U.S. Cl. ...................................... 327/108; 327/112

(58) Field of Search .................... 326/85, 87; 327/108, 327/109, 110, 111, 112, 437; 257/60, 135, 220, 263, 302, 328, 329

(56) References Cited

U.S. PATENT DOCUMENTS

| | | | | |
|---|---|---|---|---|
| 4,689,495 A | * | 8/1987 | Liu .............................. | 327/108 |
| 5,721,508 A | * | 2/1998 | Rees ........................... | 327/382 |
| 5,781,045 A | * | 7/1998 | Walia et al. ................. | 327/108 |
| 6,043,691 A | * | 3/2000 | Johnson et al. ............. | 327/112 |
| 6,127,878 A | * | 10/2000 | Hanson et al. .............. | 327/374 |

* cited by examiner

Primary Examiner—Matthew Smith
Assistant Examiner—Paul Dinh
(74) Attorney, Agent, or Firm—Blakely, Sokoloff, Taylor & Zafman LLP

(57) ABSTRACT

A series stack including a first and a second MVSD transistor is coupled between a positive power supply and a pad. The series stack has a central node. A p-driver including a first and a second P-type transistor is coupled in series with a source of the first p-type transistor coupled to a positive power supply. The drain of the second p-type transistor is coupled to the central node.

17 Claims, 5 Drawing Sheets

VOLTAGE TOLERANT HIGH DRIVE PULL-UP DRIVER FOR AN I/O BUFFER

BACKGROUND (1) Field of the Invention

The invention relates to integrated circuits. More specifically, the invention relates to a high-voltage tolerant high-voltage output buffer.

(2) Background

Technology advances in integrated circuit fabrication have led to more compact chip designs. Lower voltages processes come with the smaller size. CMOS devices are able to use low voltage power supplies to prevent damage to devices having small feature sizes, and to reduce the overall power consumption. For example, power supplies for CMOS devices are being reduced from 3.3 volts to 2.5 volts to 1.8 volts and lower. However, low voltage CMOS devices often interface with transistor-transistor logic (TTL) devices that operate at higher supply voltages, e.g., 5 volts. Unfortunately, given that the reduction in supply voltage is driven to large extent by the inability of smaller scaled devices to withstand higher voltages between the gate and source or drain, the design of input/output (I/O) buffers to interface to legacy (I/O) standards such as the *Peripheral Component Interconnect (PCI) Specification,* version 2.1, PCI Special Interest Group, 2575 NE Kathryn St. #17, Hillsboro, Oreg. 97124, December 1997 (PCI standard) is problematic. Frequently, additional transistors are added to the process which are essentially older-generation devices (with thicker gate oxides and longer channel lengths) specifically for the interface circuits. Such additional devices add process cost and complexity to the manufacturing process since additional processing steps are required to produce them. It is therefore desirable to produce a buffer capable of interfacing with higher legacy voltages without the need for extra process steps. Typically, such approaches have required the use of relatively complex circuit solutions involving stacked devices, where a stacked (cascode configuration) transistor protects a control transistor. Such stacks have limited drive due to high level shifting requirements and can be quite large, due to the additional device sizes (from the stacks) and additional circuit complexity.

The Peripheral Component Interconnect (PCI) bus standard, PCI Compliance Checklist, Revision 2.1, published Jan. 1, 1997, requires a minimum of 2.4 volts on the bus to identify a high transition. Typically, there are a large number of buffers and drivers tied to the bus, any of which can be a TTL device. Therefore, each device must be capable of driving at least 2.4 volts, and be able with withstand voltage levels as high as 6.5 volts for short durations, with S leads state levels of up to 5.5V.

Another issue with multiple supply voltages is that the different voltages have different characteristics. Some voltages may be stable before others. In a worst case scenario, the highest voltage, e.g., 5 volts, may stabilize first, and already be at its highest level while the other voltages, e.g., 3.3 volts and 1.8 volts, are still at ground or low level. Such an initial condition at power-up could expose low voltage CMOS devices to the full 5 volts. This can cause damage to the device or shorten its life. For example, this could damage the gate oxide in the transistors that are typically used in the devices. This situation can be exacerbated by the requirements of the PCI standard, which requires some of the PIN's to power up at 5 volts.

BRIEF SUMMARY OF THE INVENTION

In one embodiment, a series stack including a first and a second MOS vertical source drain (MVSD) transistor is coupled between a positive power supply and a pad is disclosed. The series stack has a central node. A p-driver including a first and a second p-type transistor is coupled in series with a source of the first p-type transistor coupled to a positive power supply. The drain of the second p-type transistor is coupled to the central node.

DETAILED DESCRIPTION

Figure 1:
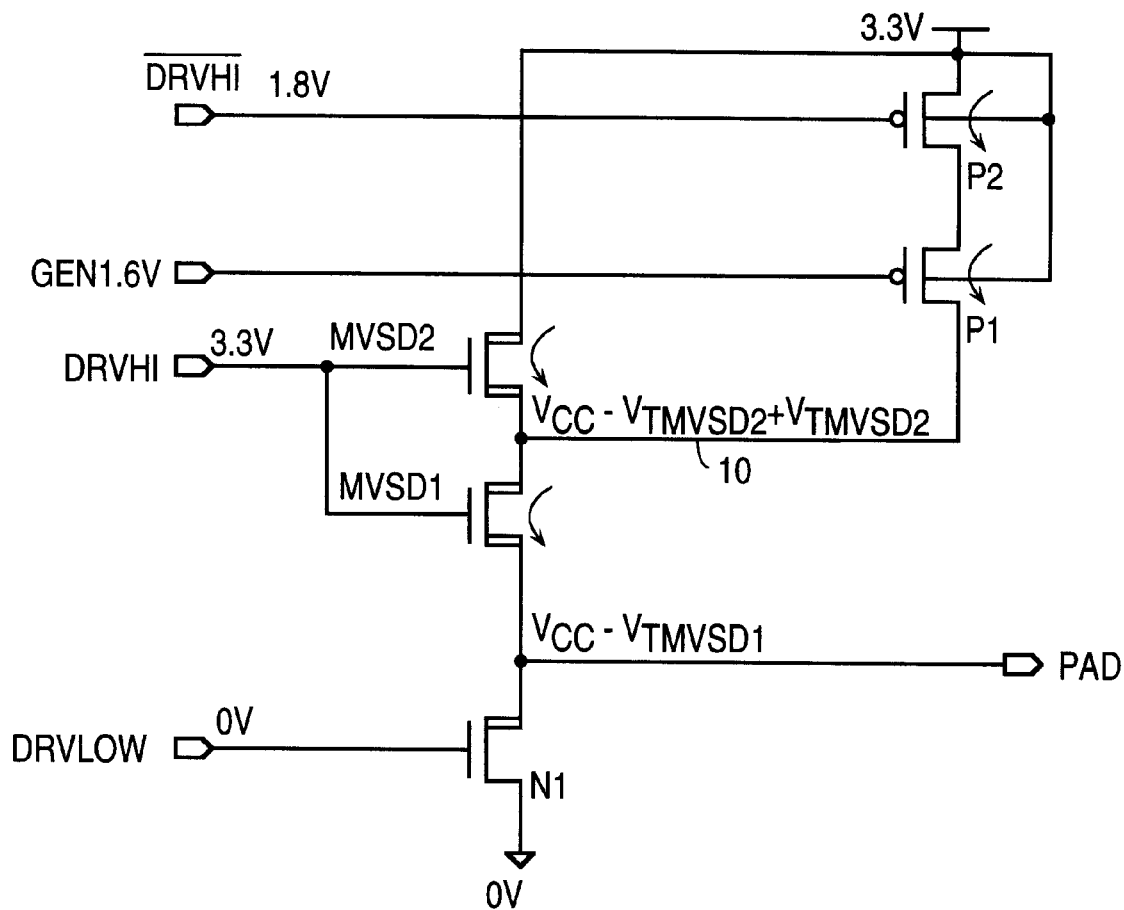
FIG. 1 is a schematic diagram of an output driver of one embodiment of the invention in a pull-up mode.

FIG. 1 is a schematic diagram of an output driver of one embodiment of the invention in a pull-up mode. In this embodiment, a pair of p-type transistors, P2 and P1 are coupled together between a positive power supply and a central node 10. The gate of P2 is driven by a complement of a drive high signal ($\overline{\text{DRVHI}}$) coming from a level shifting circuit described below. The gate of P1 is driven by a constant voltage selected to be a voltage that will not expose either P1 or P2 to greater than two volts under normal operating conditions and will ensure that P1 is on strong enough in pull-up mode to accomplish the pull-up as required. In this embodiment, the constant voltage should be between 1.3 and 2 volts and ideally tracks the 3.3V supply. The design of such circuits are well known to those skilled in the art. While in pull-up mode, zero volts is applied to the gate of transistor N1 holding it off. As used herein, a transistor is deemed "off" when in a non-conducting state such that substantially no current is flowing through the device. Conversely, a transistor is deemed "on" when substantial current is flowing through the device.

A pair of vertical source and drain double diffusion n-type metal oxide semi-conductor (VSDNMOS) transistors form an MOS vertical source drain (MVSD) stack. The MVSD stack, includes MVSD2 and MVSD1 coupled in series such that the shared node is central node 10. The drain at MVSD1 is coupled to a pad. The gates of both MVSD2 and MVSD1 are driven by a DRVHI signal from the level shifter. A pull down driver N1 is coupled between ground and the pad. The MVSD transistors can tolerate a high drain to gate voltage in DC, as well as a high gate to drain voltage when there is a large current flowing in the device. They do not require additional processing steps over the original thin-gate process as they utilize the same thin-gate as the core logic devices. The gate of N1 is driven by a drive low (DRVLOW) signal from the level shifter (not shown). This pulldown device is a vertical drain MOS (MVD) transistor, which can withstand a high drain to gate voltage. Like the MVSD device, it requires no additional processing steps over the original thin-gate transistors.

In pull-up mode, DRVHI is 3.3 volts, DRVLOW is 0 volts, and $\overline{\text{DRVHI}}$ is 1.8 volts. By applying 3.3 volts to the gates at MVSD2 and MVSD1, MVSD2 raises the intermediate node to $V_{CC}$ (nominally 3.3 volts) minus a threshold voltage $V_T$ of MVSD2, and MVSD1 raises the pad to $V_{CC}$ minus $V_T$ of MVSD1. Additionally, the $\overline{\text{DRVHI}}$ signal turns on transistor P2, which drives intermediate node 10 to $V_{CC}$. Accordingly, the drive provided by the p-driver is relatively low, as it acts merely to finish the pull-up. Notably, the drive capabilities of the MVSD transistors are much greater than the p-type transistors of equivalent size, particularly if the p-devices have gates of insufficient thickness to withstand the pad voltages and must be protected by a stack configuration. By reducing the pull-up required of the p-stack, the device, as well as the overall buffer circuit, size is reduced. By selecting MVSD1 to have a threshold voltage very close to zero or negative, i.e., depletion mode, for example, −70 mV, the pad will be driven to a true 3.3 V rail voltage. While the driver will function acceptably for many applications even if the threshold of MVSD2 is very low or depletion mode, MVSD2 may have a threshold voltage much higher than that of MVSD1, for example, 250 mV. This will allow the buffer to meet a wider range of standard specifications, particularly for the buffer leakage, c.f., the 5V vs. 3.3V specifications found in the PCI Standard.

Figure 2:
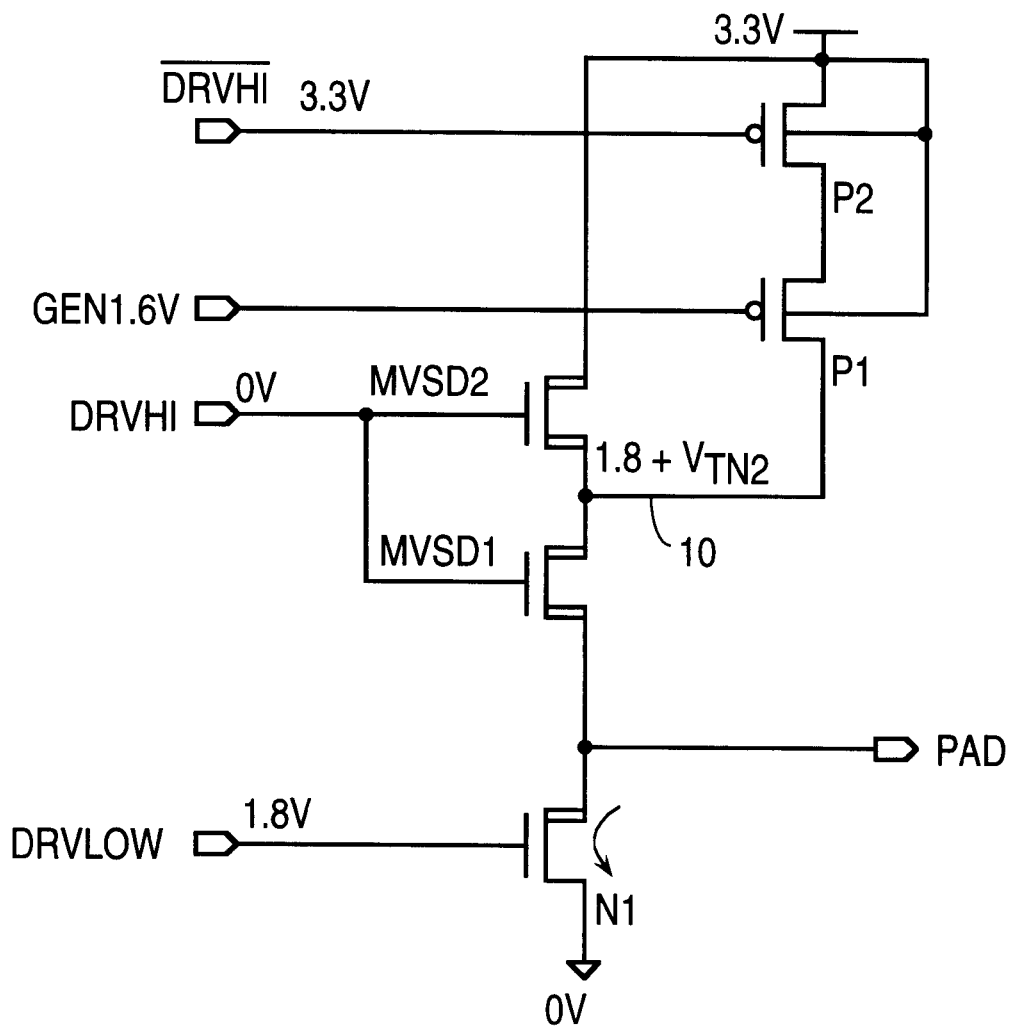
FIG. 2 shows the output driver of FIG. 1 in pull down mode.

FIG. 2 shows the output driver of FIG. 1 in pull down mode. In this mode, zero volts is applied to the gates in the MVSD stack, while 3.3 volts. is applied to the gate of P2. In this mode, P2 and the transistors of the MVSD stack are held off. DRVLOW is asserted high, to e.g., 1.8 volts, causing N1 to turn on and pull the pad down to zero volts.

Figure 3:
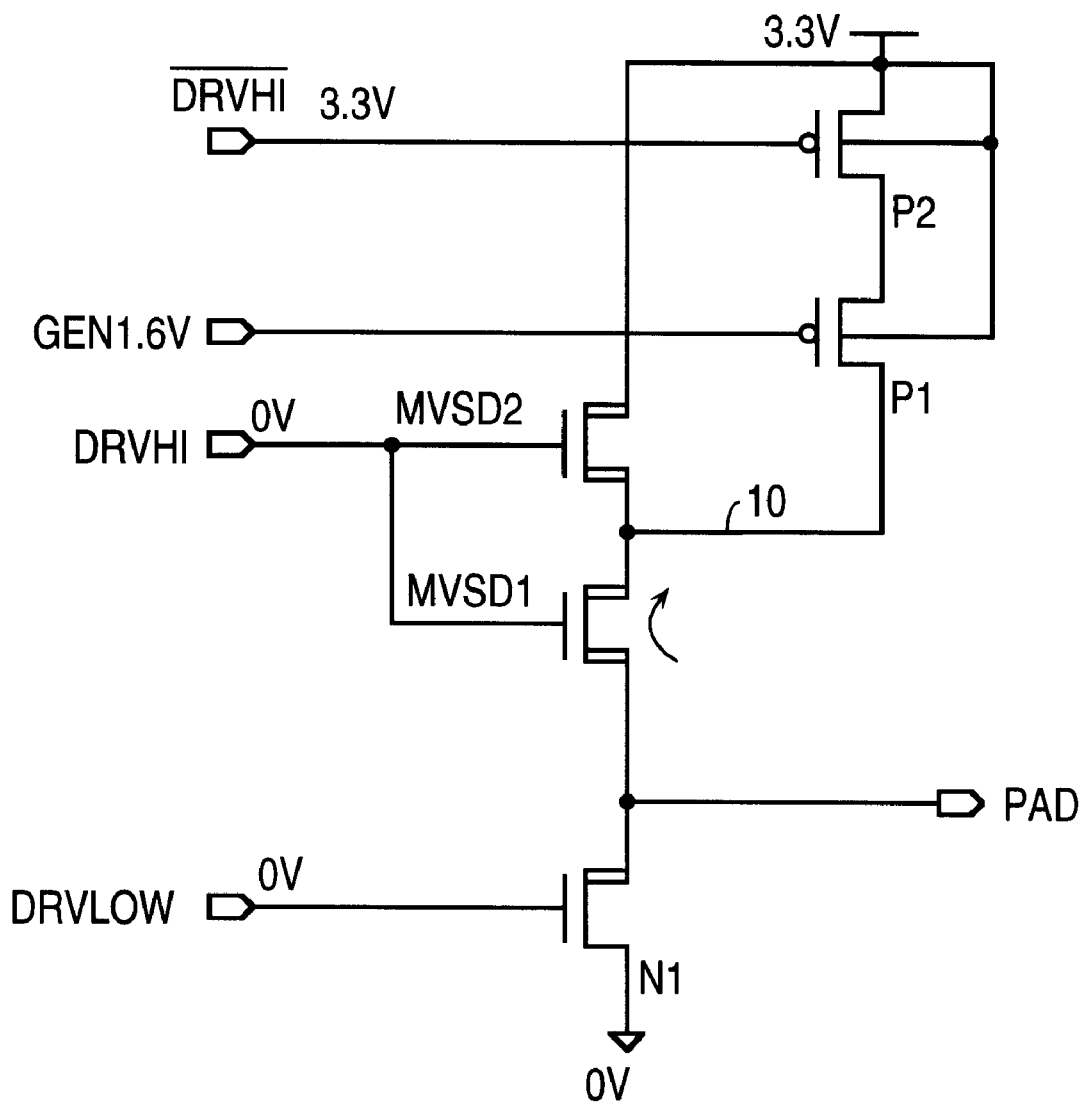
FIG. 3 shows the output driver of FIG. 1 in the tri-state mode.

FIG. 3 shows the output driver of FIG. 1 in the tri-state mode. In this mode, the gates of the MVSD stack are held to zero. DRVLOW is zero and DRVHI is 3.3 volts. This results in all transistors of the driver being off under steady state conditions, absent leakage from the pad. It is in this mode when the pad is floating that a legacy device may drive the pad to an overvoltage condition, e.g. exceeding 5 volts. Under this condition, leakage current through MVSD1 may cause central node 10 to rise over time. When MVSD1 is a depletion device, treating the pad as the drain and the central node 10 as the source, as the current flows, the central node will rise to become increasingly positive. Since the gate of MVSD1 is held at zero volts, the $V_{GS}$ term becomes increasingly negative. Accordingly, the overdrive equation given by $V_{GS}-V_T$ (even with negative $V_T$) will become sufficiently negative to hold MVSD1 cutoff, with a corresponding decrease in leakage across the device until it is balanced by the leakage contributions of MVSD2 and the PMOS stack, until an equilibrium condition is attained on the central node. This typically occurs at approximately 1.0 to 1.5 volts, well within the voltage tolerance of the P1 device. Even if the leakage characteristics are such that the foregoing did not occur, at a point a threshold voltage above $V_{CC}$, the p-stack turns on and clamps the central node 10 to $V_{CC}$. Thus even in this case, the maximum exposure of P1 is to $V_{CC}+V_{TP2}-1.6V$ (the latter being the gate voltage at P1) since the constant gate voltage of P1 is defined to track the power supply voltage, the maximum exposure remains below the tolerance limits of P1. In one embodiment, provided good subthreshold slope, MVSD1 and MVSD2 are long channel devices. By good subthreshold slope, it is meant that the subthreshold leakage has an exponential dependence on the $V_{GS}$ voltage. In a 0.25 μm process MVSD device, this typically occurs with a channel length greater than 0.5 μm.

As mentioned previously, the output buffer may be exposed to high voltages on the pad before the buffer power has been applied, for instance at power-up, where the higher voltages typically reach their steady-state values before the lower voltages. This buffer configuration naturally protects in this condition since both the DRVHI and DRVLOW signals will be at 0V. Thus, the buffer is in its natural tri-state condition and the intermediate nodes are protected from the high voltage on the pad as described in the preceding paragraph. No additional protection circuit mechanisms are required.

Figure 4:
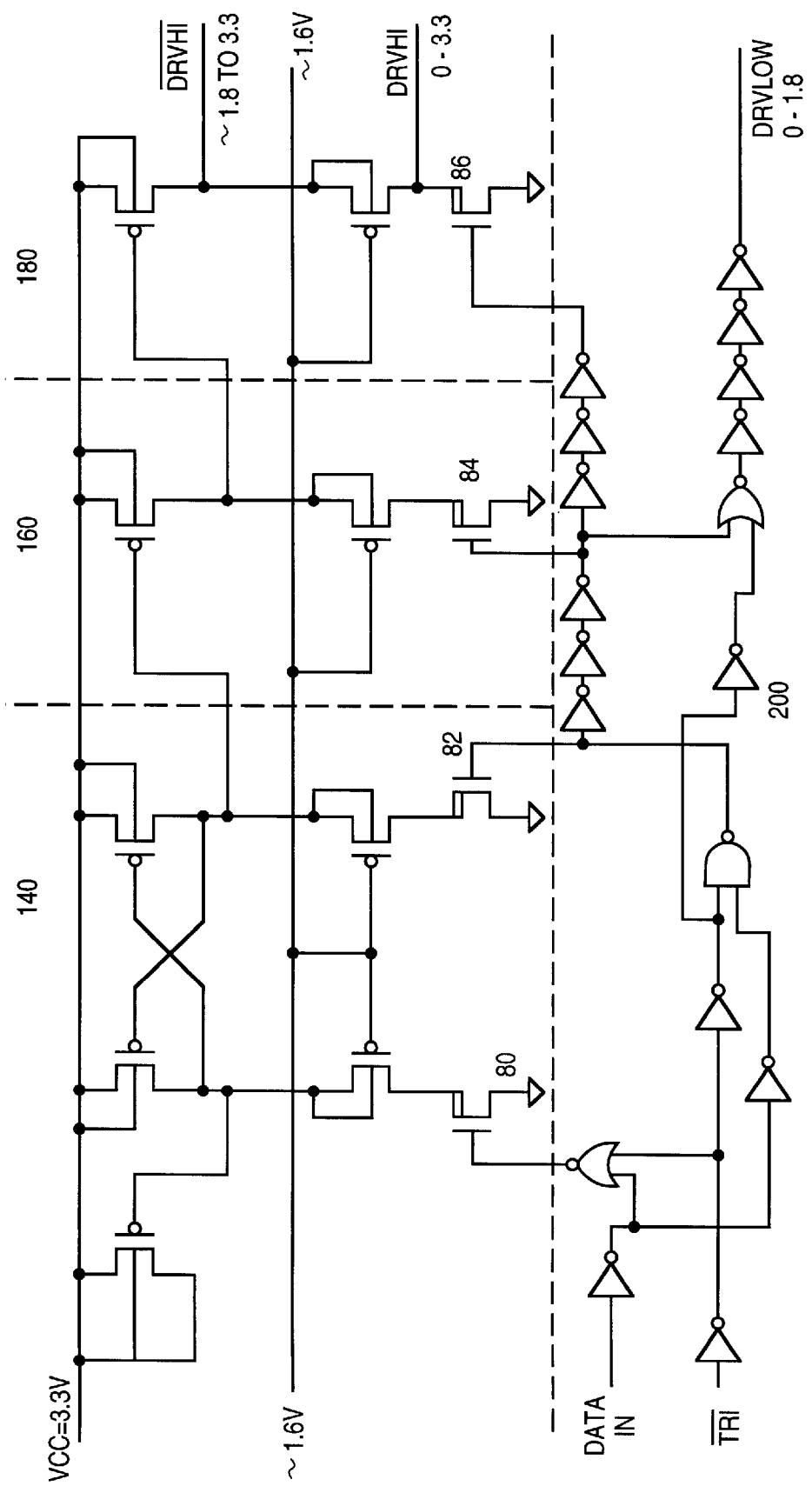
FIG. 4 shows a level shifter for use with an output driver in one embodiment of the invention.

FIG. 4 shows a level shifter for use with an output driver in one embodiment of the invention. The level shifter of FIG. 4 basically includes four subsections, a level shifting stage 140, a pair of gain stages 160, 180, and the data in tri-state combinational logic section 200. The inputs to the level shifter and the combinational logic 200 dictate the operation mode of the output drives. One of ordinary skill will recognize that level shifting is only required for the pull-up side of the output driver. For example, in one embodiment, the shift must occur from zero to 1.8 volts (the nominal core power supply voltage of the embodiment) to a full swing of zero to 3.3 volts (sufficient to meet the output voltage of 2.4V required of the 5V standard, as well as the 3.3V required of the 3.3V standard. A set of vertical drain NMOS (VDNMOS) transistors 80, 82, 84, 86 are employed to protect the combinational logic 200 and the respective gate oxides from the full swing DRVHI signal. The constant voltage of approximately 1.6 volts which tracks $V_{CC}$ provides a bias voltage which may be generated in a conventional manner. Notably, $\overline{DRVHI}$ generated by the level shifter is not full swing, driving between approximately 1.8 and 3.3V, rather than rail to rail. However, because $\overline{DRVHI}$ drives the gate of P2 at 1.8 volts during pull-up, P2 will still be hard on. Accordingly, no detrimental performance results.

Figure 5:
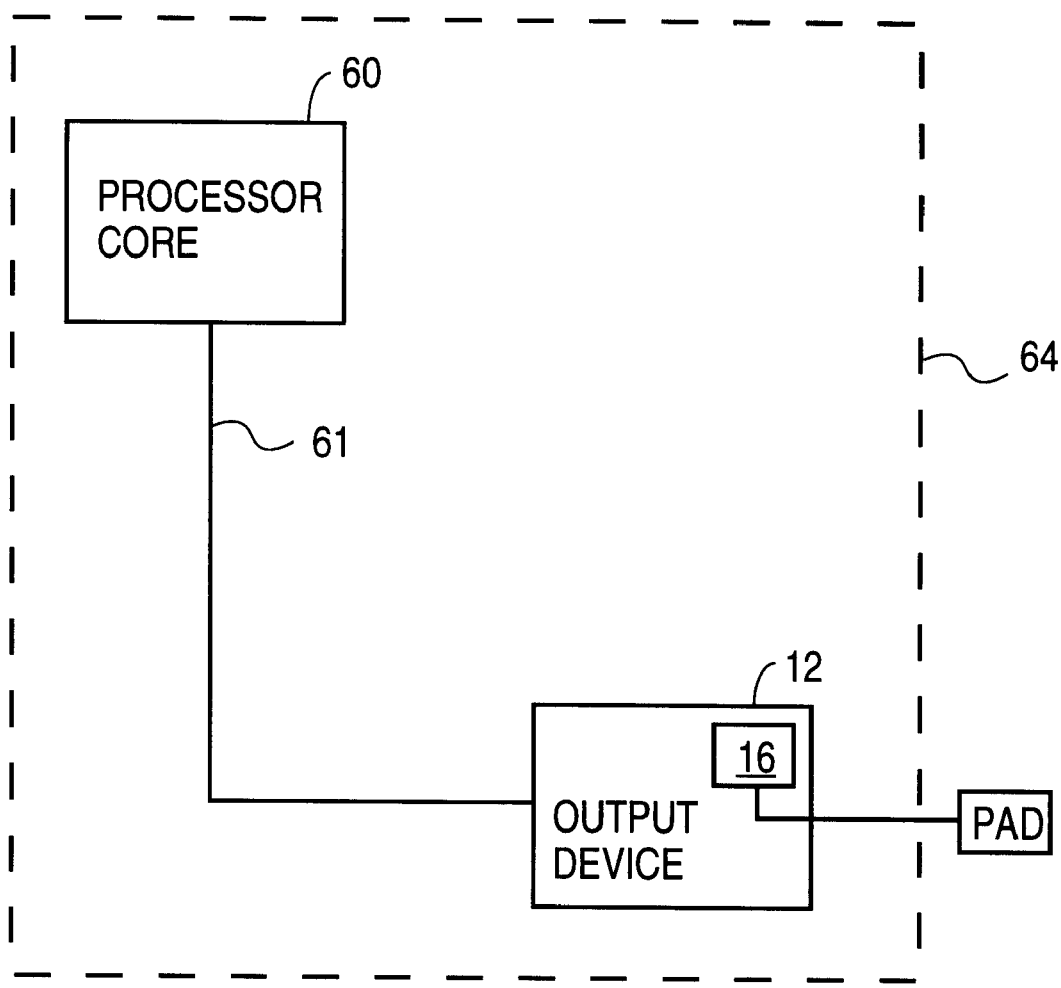
FIG. 5 shows a block diagram of an integrated circuit using the invention.

FIG. 5 shows a block diagram of an integrated circuit 64 using the invention. Processor core 60 is coupled to output buffer 12 by output line 61. Output buffer 12 includes the pull-up driver 16 of the instant invention. Pull-up driver 16 is coupled to the pad. The processor 60 could be any well-known processor. Moreover, other devices having I/O capabilities may be coupled to the output buffer instead of a processor core. Integrated circuit 64 is fabricated by known techniques.

In the foregoing specification, the invention has been described with reference to specific embodiments thereof. It will, however, be evident that various modifications and changes can be made thereto without departing from the broader spirit and scope of the invention as set forth in the appended claims. The specification and drawings are, accordingly, to be regarded in an illustrative rather than a restrictive sense.

What is claimed is:

1. An apparatus comprising:
   a series stack including a first MOS vertical source drain (MVSD) transistor and a second MVSD transistor, the stack to be coupled between a positive power supply and a pad and having a central node; and
   a p-driver including a first p-type transistor having a source to be coupled to the positive power supply and a second p-type transistor coupled to the first p-type transistor and having its drain coupled to the central node.

2. The apparatus of claim 1 further comprising:
   a level shifter coupled to the p-driver and the series stack to provide gate voltages to the p-driver and series stack.

3. The apparatus of claim 1 wherein the first MVSD transistor has a threshold voltage of approximately 0 V.

4. The apparatus of claim 3 wherein the second MVSD transistor has a threshold voltage substantially greater than the threshold voltage of the first MVSD transistor.

5. The apparatus of claim 1 wherein a gate of the first p-type transistor is to be driven by a first signal and wherein the first and second MVSD transistor each have a gate to be driven by an inverse of the first signal.

6. The apparatus of claim 1 wherein the first and second MVSD transistors each have a channel sufficiently long to provide good subthreshold slope.

7. A method comprising:

turning on an MOS vertical source drain (MVSD) stack coupled between a pad and a positive power supply; driving a central node of the MVSD stack to a power supply voltage minus a threshold voltage of one of the MVSD transistors;

turning on a pull-up driver coupled to a central node of the MVSD stack; and driving the central node from the pull-up driver to the power supply voltage.

8. The method of claim 7 further comprising:

providing a first transistor of the MVSD stack having a threshold voltage of approximately 0 V and a second transistor having a significantly higher threshold voltage.

9. The method of claim 7 further comprising:

operating a first MVSD transistor in a depletion mode.

10. An integrated circuit including an output driver, the output driver comprising:

a series stack including a first MVSD transistor and a second MVSD transistor, the stack coupled between the positive power supply and a pad and having a central node; and a p-driver having a first transistor with a source to be coupled to a positive power supply and a second transistor having a drain coupled to the central node.

11. The integrated circuit of claim 10 further comprising:

a level shifter coupled to a gate of the p-driver and a gate of the series stack.

12. The integrated circuit of claim 10 wherein the first MVSD transistor is closest to the pad and has a threshold voltage of approximately 0 V.

13. The integrated circuit of claim 12 wherein the second MVSD transistor has a threshold voltage substantially greater than the threshold voltage of the first MVDS transistor.

14. The integrated circuit of claim 10 wherein:

the first transistor has a gate to be driven by a first signal; and the second transistor has a gate driven by a substantially constant voltage, and a drain coupled to the central node of the series stack.

15. The integrated circuit of claim 14 wherein the first and second MVSD transistor each have a gate to be driven by an inverse of the first signal.

16. The integrated circuit of claim 10 wherein the first MVSD transistor has a threshold voltage less than zero.

17. The integrated circuit of claim 1 further comprising an MOS vertical drain (MVD) pulldown device.

* * * * *

UNITED STATES PATENT AND TRADEMARK OFFICE
CERTIFICATE OF CORRECTION

PATENT NO. : 6,388,475 B1
DATED : May 14, 2002
INVENTOR(S) : Clark et al.

It is certified that error appears in the above-identified patent and that said Letters Patent is hereby corrected as shown below:

<u>Title page,</u>
Item [73], Assignee, delete "Intle", insert -- Intel --.

Signed and Sealed this

Seventeenth Day of September, 2002

Attest:

Attesting Officer

JAMES E. ROGAN
*Director of the United States Patent and Trademark Office*